United States Patent
Lee et al.

(10) Patent No.: US 8,525,220 B2
(45) Date of Patent: Sep. 3, 2013

(54) LIGHT EMITTING DIODE WITH IMPROVED STRUCTURE

(75) Inventors: Sang Joon Lee, Ansan-si (KR); Dae Sung Kal, Ansan-si (KR); Dae Won Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 901 days.

(21) Appl. No.: 12/143,963

(22) Filed: Jun. 23, 2008

(65) Prior Publication Data

US 2009/0020780 A1    Jan. 22, 2009

(30) Foreign Application Priority Data

Jul. 20, 2007 (KR) .................. 10-2007-0072629

(51) Int. Cl.
*H01L 33/00* (2010.01)

(52) U.S. Cl.
USPC ................................. 257/101; 257/E33.001

(58) Field of Classification Search
USPC .......................... 257/101, E33.001
See application file for complete search history.

(56) References Cited

U.S. PATENT DOCUMENTS

| | | | |
|---|---|---|---|
| 6,057,565 A | 5/2000 | Yoshida et al. | |
| 7,569,866 B2 * | 8/2009 | Konno et al. | 257/103 |
| 2005/0230674 A1 * | 10/2005 | Takahashi et al. | 257/14 |
| 2006/0108603 A1 * | 5/2006 | Uemura et al. | 257/194 |
| 2007/0075327 A1 | 4/2007 | Arai et al. | |
| 2007/0096077 A1 | 5/2007 | Sanga et al. | |
| 2008/0108160 A1 * | 5/2008 | Goto et al. | 438/31 |

OTHER PUBLICATIONS

Extended European Search Report dated Apr. 6, 2010 issued for European Application No. 08011718.7.

\* cited by examiner

*Primary Examiner* — William D Coleman
*Assistant Examiner* — Christine Enad
(74) *Attorney, Agent, or Firm* — H. C. Park & Associates, PLC

(57) ABSTRACT

Disclosed is a light emitting diode (LED) with an improved structure. The LED comprises an N-type semiconductor layer, a P-type semiconductor layer and an active layer interposed between the N-type and P-type semiconductor layers. The P-type compound semiconductor layer has a laminated structure comprising a P-type clad layer positioned on the active layer, a hole injection layer positioned on the P-type clad layer, and a P-type contact layer positioned on the hole injection layer. Accordingly, holes are more smoothly injected into the active layer from the P-type semiconductor layer, thereby improving the recombination rate of electrons and holes.

10 Claims, 1 Drawing Sheet

LIGHT EMITTING DIODE WITH IMPROVED STRUCTURE

CROSS REFERENCE TO RELATED APPLICATION

This application claims priority from and the benefit of Korean Patent Application No. 10-2007-0072629, filed on Jul. 20, 2007, which is hereby incorporated by reference for all purposes as if fully set forth herein.

BACKGROUND OF THE INVENTION

1. Field of the Invention

The present invention relates to a light emitting diode, and more particularly, to a light emitting diode with an improved laminated structure of a P-type semiconductor layer for more smoothly injecting holes into an active layer.

2. Discussion of the Background

In general, since Group III element nitrides, such as GaN, AlN and InGaN, have excellent thermal stability and a direct transition type energy band structure, they have recently come into the spotlight as materials for light emitting diodes (LEDs) in blue and ultraviolet regions. Particularly, an InGaN compound semiconductor has been noticed for its narrow band gap. LEDs using such a GaN-based compound semiconductor are used in various applications such as large-sized full-color flat panel displays, backlight sources, traffic lights, indoor illumination, high density light sources, high resolution output systems and optical communications.

High-frequency white LEDs are currently expected to replace fluorescent lamps. In particular, efficiency of white LEDs has reached the level similar to that of typical fluorescent lamps. However, efficiency of LEDs can continue to improve. Particularly, increasing internal quantum efficiency by improving crystal quality and a structure of an epitaxial layer is required.

An LED generally has a structure in which an active layer is interposed between an N-type semiconductor layer and a P-type semiconductor layer. Electrons and holes are injected into the active layer from the N-type and P-type semiconductor layers, respectively, and the electrons and holes are recombined in the active layer, thereby emitting light.

A variety of trials are being conducted to increase the recombination rate of electrons and holes by optimizing the N-type semiconductor layer, the P-type semiconductor layer, and the active layer. In addition, increased internal quantum efficiency may be achieved by improving a structure of the semiconductor layers.

Meanwhile, impurities from the P-type semiconductor layer are diffused into the active layer, and therefore, the active layer may deteriorate. The impurities diffused into the active layer form electron traps, thereby lowering luminous efficiency. Therefore, preventing unintended impurities from diffusing into the active layer is desired.

In the meantime, the layers are generally formed by a metal organic chemical vapor deposition (MOCVD) technique. In order to form epitaxial layers with excellent crystal quality, the layers are generally formed in-situ. In the in-situ process, after each layer is formed, a process for changing a source gas is performed. At this time, gas containing nitrogen, e.g., ammonia ($NH_3$) is introduced into a chamber without any reactive gas in order to prevent a deposited epitaxial layer from decomposing.

However, the ammonia reacts with the deposited epitaxial layer and decomposes. Then, hydrogen contained in the ammonia is combined with a P-type impurity, e.g., Mg to prevent Mg from being activated in the semiconductor layer. Combinations of the hydrogen and Mg near a surface of the laminated structure may decrease to a certain extent by a heat treatment process. However, it is difficult to decompose the combinations of the hydrogen and Mg inside the laminated structure. Thus, the production and mobility of holes is reduced, thereby lowering internal quantum efficiency.

Therefore, an improved laminated structure of a P-type semiconductor layer, which can prevent hydrogen and doped impurities from being combined, is required.

SUMMARY OF THE INVENTION

This invention provides an LED in which the injection speed of holes injected into an active layer is increased by improving a structure of a P-type semiconductor layer, so that internal quantum efficiency of the LED can be improved.

This invention also provides an LED having a structure for preventing impurities from being diffused into an active layer from a P-type semiconductor layer.

This invention also provides an LED having a structure in which the production and injection of holes is enhanced.

Additional features of the invention will be set forth in the description which follows, and in part will be apparent from the description, or may be learned by practice of the invention.

According to embodiments of the present invention, an LED with an improved structure is provided. The LED comprises an N-type semiconductor layer, a P-type semiconductor layer and an active layer interposed between the N-type and P-type semiconductor layers. The P-type semiconductor layer has a laminated structure comprising a P-type clad layer positioned on the active layer, a hole injection layer positioned on the P-type clad layer, and a P-type contact layer positioned on the hole injection layer.

The P-type clad layer is employed to improve recombination rate of electrons and holes by restricting electrons injected from the N-type semiconductor layer in the active layer. The hole injection layer, which is a major layer generating holes, allows holes of the hole injection layer to be injected into the active layer. In addition, the P-type contact layer is employed to decrease contact resistance between an electrode or electrode pad formed on the P-type contact layer and the P-type semiconductor layer. The P-type semiconductor layer is formed to have a laminated structure of a clad layer, a hole injection layer and a contact layer, so that the production of holes and the injection of holes into the active layer are improved, thereby enhancing internal quantum efficiency.

Meanwhile, a doping concentration of the hole injection layer may be lower than that of the P-type clad layer, and a doping concentration of the P-type contact layer may be higher than that of the P-type clad layer.

The P-type contact layer is formed to have the relatively high doping concentration, so that the electrode to be formed on the P-type contact layer is in ohmic contact with the P-type semiconductor layer. When the hole injection layer is formed to have a relatively high doping concentration, the amount of produced holes may be increased. However, the mobility of holes is decreased, and the injection speed of holes injected into the active layer is lowered, so that the recombination rate of electrons and holes is decreased. Accordingly, the hole injection layer is formed the relatively low doping concentration, so that the mobility of holes can be enhanced. Further, the P-type clad layer is formed to have the relatively high doping concentration, so that the movement of holes from the hole injection layer to the active layer can be promoted.

In addition, the thickness of the hole injection layer may be larger than that of the P-type clad layer, and the thickness of the P-type contact layer may be smaller than that of the P-type clad layer. Accordingly, a sufficient amount of holes can be produced in the hole injection layer having a relatively low doping concentration. Further, the P-type contact layer is formed to be relatively thin, so that it is possible to prevent the mobility of holes from being decreased entirely in the P-type semiconductor layer.

The bandgap of the P-type clad layer may be wider than that of the hole injection layer, and the bandgap of the hole injection layer may be equal to that of the P-type contact layer. The bandgap of each layer in the P-type semiconductor layer is controlled, so that current diffusion can be effectively achieved. Further, an energy barrier between the P-type contact layer and the hole injection layer can be removed, so that movements of holes in the P-type semiconductor layer can be promoted.

The hole injection layer and the P-type contact layer may be formed of GaN. The P-type clad layer may be formed of $Al_xIn_yGa_{1-x-y}N$ ($0<x<1$, $0\leq y<1$, $x+y<1$).

Meanwhile, an undoped layer may be interposed between the active layer and the P-type clad layer, and the undoped layer may be formed of $Al_xIn_yGa_{1-x-y}N$ ($0<x<1$, $0\leq y<1$, $x+y<1$). The undoped layer prevents impurities from being diffused into the active layer from the P-type clad layer.

Also, a lower undoped layer may be interposed between the P-type clad layer and the hole injection layer. The lower undoped layer may be formed of GaN and grown by growing the P-type clad layer and then stopping supply of a source gas containing Al and/or In. Accordingly, it is possible to prevent an impurity in the P-type clad layer, e.g., Mg, from being combined with hydrogen.

In addition, an upper undoped layer may be interposed between the hole injection layer and the P-type contact layer. The upper undoped layer may be grown of GaN. The upper undoped layer prevents an impurity in the hole injection layer, e.g., Mg, from being combined with hydrogen.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
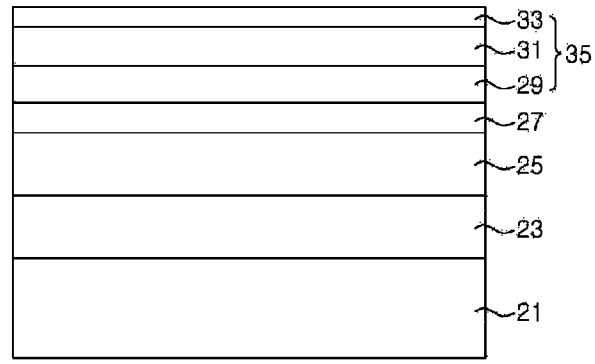
FIG. 1 is a sectional view illustrating an LED according to an embodiment of the present invention.

Hereinafter, embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

FIG. 1 is a sectional view illustrating an LED according to an embodiment of the present invention.

Referring to FIG. 1, an N-type semiconductor layer 25 is positioned on a substrate 21. In addition, a buffer layer 23 is interposed between the substrate 21 and the N-type semiconductor layer 25, wherein the buffer layer comprises a low-temperature buffer layer and a high-temperature buffer layer. The substrate 21 is not limited particularly but may be, for example, a sapphire, spinel or silicon carbide substrate.

The N-type semiconductor layer 25 may include an electron injection layer and an N-type clad layer. The N-type semiconductor layer may be formed of (Al, Ga, In)N-based Group III nitride semiconductor layer. For example, the N-type semiconductor layer 25 may be formed of GaN and/or AlInGaN. The N-type semiconductor layer 25 may be doped with an N-type impurity, e.g., Si.

A P-type semiconductor layer 35 is positioned above the N-type semiconductor layer 25, and an active layer 27 is interposed between the N-type and P-type semiconductor layers 25 and 35. The active layer 27 may be formed to have a single quantum well structure or a multiple quantum well structure in which well layers and barrier layers are alternately laminated. The well layer may be formed of InGaN, and the barrier layer may be formed of (Al, In, Ga)N. The well layer contains In more than the barrier layer, thereby forming a quantum well.

The P-type semiconductor layer 35 comprises a P-type clad layer 29, a hole injection layer 31 and a P-type contact layer 33. The bandgap of the P-type clad layer 29 is wider than that of the hole injection layer 31, and the bandgap of the hole injection layer 31 is equal to that of the P-type contact layer 33. Since the P-type contact layer 33 and the hole injection layer 31 have the same bandgap, a current introduced from an electrode (not shown) may be diffused in the P-type contact layer 33 and then flow into the hole injection layer 31 without energy barriers. The P-type clad layer 29 is formed of a semiconductor having a wide bandgap so that electrons are restricted in the active layer 27. In addition, since the P-type clad layer 29 has a bandgap relatively wider than the hole injection layer 31, the P-type clad layer 29 helps current to be diffused in the hole injection layer 31.

Meanwhile, a doping concentration of the hole injection layer 31 may be lower than that of the P-type clad layer 29, and a doping concentration of the P-type contact layer 33 may be higher than that of the P-type clad layer 29. The P-type contact layer 33 is in contact with a conductive electrode (not shown) made of indium tin oxide (ITO) or a metallic material, and is highly doped with impurities to lower contact resistance between the conductive electrode and the P-type contact layer 33. However, the hole injection layer 31 produces holes to be injected into the active layer 27. If a doping concentration of the hole injection layer 31 is high, the mobility of holes is decreased in the hole injection layer 31. Thus, the hole injection layer 31 is formed to have a doping concentration lower than the P-type contact layer 33, thereby improving the mobility of holes. The P-type clad layer 29 is also formed to have a doping concentration lower than the P-type contact layer 33 so that holes move smoothly. In addition, holes produced from the hole injection layer 31 are injected into the active layer 27 via the P-type clad layer 29. If the doping concentration of the P-type clad layer 29 is higher than that of the hole injection layer 31, the movement of holes from the hole injection layer 31 to the P-type clad layer 29 can be promoted.

The hole injection layer 31 may be thicker than the P-type clad layer 29, and the P-type contact layer 33 may be thinner than the P-type clad layer 29. If the hole injection layer 31 is thicker than the P-type clad layer 29, sufficient holes with a relatively low doping concentration can be produced. Further, the P-type contact layer 33 is thin so that it is possible to reduce influence on the mobility of holes and to prevent a forward voltage from increasing. If the P-type clad layer 29 is relatively thick, a forward voltage is increased by interrupting the injection of holes, and thus, the recombination rate of electrons and holes is lowered. Therefore, the P-type clad layer 29 may be thinner than the hole injection layer 31, so that the injection of holes can be enhanced.

The P-type clad layer 29 may be formed of $Al_xIn_yGa_{1-x-y}N$ (0<x<1, 0≦y<1, x+y<1). The hole injection layer 31 and the P-type contact layer 33 may be formed of GaN. These layers may be formed in-situ by an MOCVD technique, wherein for example, Mg may be used as a P-type impurity.

Figure 2:
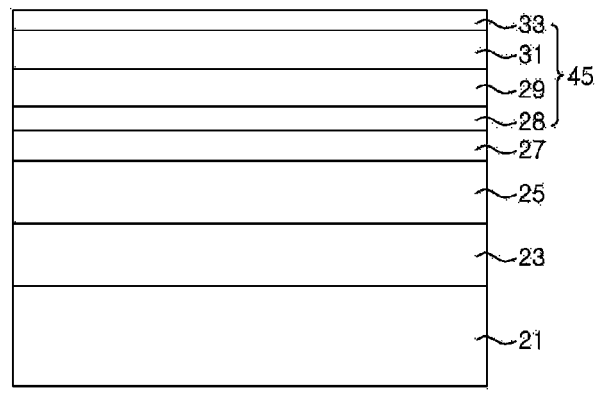
FIG. 2 is a sectional view illustrating an LED according to another embodiment of the present invention.

FIG. 2 is a sectional view illustrating an LED according to another embodiment of the present invention.

Referring to FIG. 2, the LED according to this embodiment generally has the same structure as the LED described with reference to FIG. 1 except that a P-type semiconductor layer 45 further includes an undoped layer 28 interposed between an active layer 27 and a P-type clad layer 29. The undoped layer 28 may be formed of the same series semiconductor as the P-type clad layer 29, but is not artificially doped with an impurity. For example, if the P-type clad layer 29 is formed of P-type $Al_xIn_yGa_{1-x-y}N$ (0<x<1, 0≦y<1, x+y<1), the undoped layer 28 may be formed of undoped $Al_xIn_yGa_{1-x-y}N$ (0<x<1, 0≦y<1, x+y<1). The composition ratio of the undoped layer 28 does not need to be exactly equal to that of the P-type clad layer 29, and the undoped layer 28 may be slightly different from the P-type clad layer 29 in composition ratio.

The undoped layer 28 prevents an impurity, with which the P-type clad layer 29 is doped, e.g., Mg, from diffusing into the active layer 27. Accordingly, it is possible to prevent non-light emitting recombination from generating by the impurity diffused into the active layer, thereby enhancing luminous efficiency.

Figure 3:
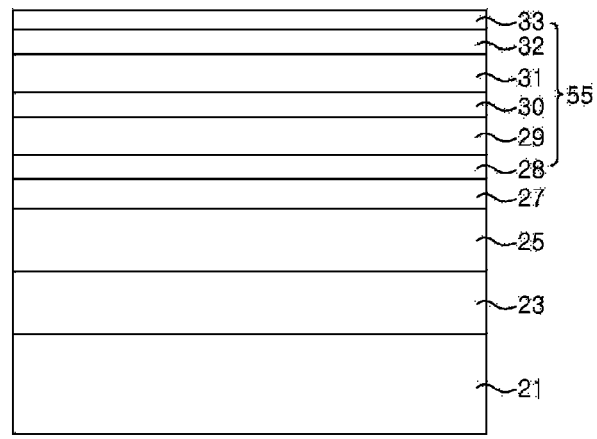
FIG. 3 is a sectional view illustrating an LED according to a further embodiment of the present invention.

FIG. 3 is a sectional view illustrating an LED according to a further embodiment of the present invention.

Referring to FIG. 3, the LED according to this embodiment generally has the same structure as the LED described with reference to FIG. 2 except that a P-type semiconductor layer 55 further includes a lower undoped layer 30 interposed between a P-type clad layer 29 and a hole injection layer 31 and/or an upper undoped layer 32 interposed between the hole injection layer 31 and a P-type contact layer 33.

The lower and upper undoped layers 30 and 32 may be formed of the same semiconductor as the hole injection layer 31 without artificial doping. For example, lower and upper undoped layers 30 and 32 may be formed of undoped GaN.

The lower undoped layer 30 may be grown by growing the P-type clad layer 29 of AlInGaN in a chamber and then interrupting inflow of a source gas containing Al and In. An undoped layer 28 prevents hydrogen of $NH_3$ from combining with impurities in the P-type clad layer 29 while being grown, and also prevents hydrogen combining with impurities in the P-type clad layer 29 in a process of introducing the $NH_3$ before the hole injection layer 31 is formed by an in-situ process. Accordingly, Mg in the P-type clad layer 29 can be increasingly activated.

Before the P-type contact layer 33 is formed, the upper undoped layer 30 prevents hydrogen from combining with impurities in the hole injection layer 31, thereby helping activation of impurities in the hole injection layer 31.

In this embodiment, the undoped layer 28 is shown as interposed between the active layer 27 and the P-type clad layer 29 in FIG. 3. However, the undoped layer 28 and the lower and upper undoped layers 30 and 32 do not need to be used together. The undoped layer 28 may be omitted.

According to the exemplary embodiments of the present invention, electrons are restricted in an active layer by improving a structure of a P-type semiconductor layer and the recombination rate of electrons and holes is enhanced by injecting holes into the active layer smoothly, whereby internal quantum efficiency can be improved. Further, non-light emitting recombination is prevented by preventing impurities from diffusing into the active layer from the P-type semiconductor layer, so that luminous efficiency can be enhanced. Furthermore, undoped GaN is formed between the P-type clad layer and a hole injection layer and/or between the hole injection layer and a P-type contact layer to prevent Mg from combining with hydrogen and to help Mg to activate, thereby improving the production and injection of holes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED), comprising:
   an N-type semiconductor layer;
   a P-type semiconductor layer; and
   an active layer interposed between the N-type semiconductor layer and the P-type semiconductor layer,
   wherein the P-type semiconductor layer comprises a laminated structure, the laminated structure comprising:
      a P-type clad layer positioned on the active layer;
      a hole injection layer positioned on the P-type clad layer;
      a P-type contact layer positioned on the hole injection layer; and
      an upper undoped layer interposed between the hole injection layer and the P-type contact layer, the upper updoped layer contacting the hole injection layer,
   wherein a doping concentration of the hole injection layer is lower than a doping concentration of the P-type clad layer,
   wherein a bandqap of the P-type clad layer is wider than a bandqap of the hole injection layer, and the bandqap of the hole injection layer is equal to a bandqap of the P-type contact layer, and
   wherein the hole injection layer, the upper undoped layer contacting the hole injection layer, and the P-type contact layer are semiconductor layers having a substantially identical band gap.

2. The LED as claimed in claim 1, wherein a doping concentration of the P-type contact layer is higher than the doping concentration of the P-type clad layer.

3. The LED as claimed in claim 2, wherein the hole injection layer is thicker than the P-type clad layer, and the P-type contact layer is thinner than the P-type clad layer.

4. The LED as claimed in claim 1, further comprising an undoped layer interposed between the active layer and the P-type clad layer.

5. The LED as claimed in claim 4, wherein the undoped layer physically contacts both the hole injection layer and the P-type contact layer.

6. The LED as claimed in claim 1, further comprising a lower undoped layer interposed between the P-type clad layer and the hole injection layer.

7. The LED as claimed in claim 1, further comprising:
   a first undoped layer interposed between the active layer and the P-type clad layer; and
   a second undoped layer on the P-type clad layer.

8. The LED as claimed in claim 7, wherein the first undoped layer physically contacts both the active layer and the P-type clad layer.

9. The LED as claimed in claim 7, wherein the second undoped layer is interposed between the P-type clad layer and the hole injection layer.

10. The LED as claimed in claim 9, wherein the first undoped layer physically contacts both the active layer and the P-type clad layer, and the second undoped layer physically contacts both the P-type clad layer and the hole injection layer.

\* \* \* \* \*